US010039216B2

(12) United States Patent
Hansen et al.

(10) Patent No.: US 10,039,216 B2
(45) Date of Patent: Jul. 31, 2018

(54) METHOD FOR MANUFACTURING A PANEL FOR A REFLECTIVE BROADBAND ELECTROMAGNETIC SHIELD

(71) Applicant: Conductive Composites Company, LLC, Heber City, UT (US)

(72) Inventors: George Clayton Hansen, Midway, UT (US); Nathan D. Hansen, Heber, UT (US)

(73) Assignee: Conductive Composites Company, LLC, Heber City, UT (US)

( * ) Notice: Subject to any disclaimer, the term of this patent is extended or adjusted under 35 U.S.C. 154(b) by 227 days.

(21) Appl. No.: 14/832,892

(22) Filed: Aug. 21, 2015

(65) Prior Publication Data

US 2015/0366108 A1  Dec. 17, 2015

Related U.S. Application Data

(60) Division of application No. 12/948,938, filed on Nov. 18, 2010, now Pat. No. 9,144,185, which is a
(Continued)

(51) Int. Cl.
*H01R 43/00* (2006.01)
*H05K 9/00* (2006.01)

(52) U.S. Cl.
CPC ......... *H05K 9/0007* (2013.01); *H05K 9/0009* (2013.01); *H05K 9/0073* (2013.01);
(Continued)

(58) Field of Classification Search
CPC .. H05K 9/0007; H05K 9/0009; H05K 9/0073; H05K 9/0081; H05K 9/0083;
(Continued)

(56) References Cited

U.S. PATENT DOCUMENTS

| | | | | |
|---|---|---|---|---|
| 4,972,058 A | * | 11/1990 | Benson | B65D 81/3446 219/730 |
| 5,601,945 A | * | 2/1997 | Clough | B05D 1/40 429/204 |

(Continued)

*Primary Examiner* — Paul D Kim
(74) *Attorney, Agent, or Firm* — Madson IP, P.C.

(57) ABSTRACT

A panel for an electromagnetic shield includes a lightweight, porous, electrically-conductive core layer of metallic foam having generally parallel opposed surfaces and a face sheet having rigidity properties superior to the rigidity properties of the core layer laminated to a surface of the core layer. Alternatively, a panel for a broadband electromagnetic shield includes a composite fiber-reinforced core having opposed surfaces and a layered electrically-conductive composite cover disposed on a surface of the core. The cover includes a first stratum of porous metal exhibiting pronounced low-frequency electromagnetic shielding properties and a second stratum of electrically-conductive elements exhibiting pronounced high-frequency electromagnetic shielding properties secured in an overlapping electrically-continuous relationship to the first stratum, the first stratum being a metallic lattice, and the electrically-conductive elements being a non-woven veil of electrically-nonconductive metal-coated fibers.

18 Claims, 8 Drawing Sheets

Related U.S. Application Data continuation-in-part of application No. 12/698,961, filed on Feb. 2, 2010, now Pat. No. 8,415,568.

(60) Provisional application No. 61/262,386, filed on Nov. 18, 2009, provisional application No. 61/149,116, filed on Feb. 2, 2009.

(52) U.S. Cl.
CPC ......... *H05K 9/0081* (2013.01); *H05K 9/0083* (2013.01); *H05K 9/0084* (2013.01); *H05K 9/0086* (2013.01); *H05K 9/0088* (2013.01); *H05K 9/009* (2013.01); *Y10T 29/49119* (2015.01)

(58) Field of Classification Search
CPC .. H05K 9/0084; H05K 9/0086; H05K 9/0088; H05K 9/009
See application file for complete search history.

(56) References Cited

U.S. PATENT DOCUMENTS

| | | | | |
|---|---|---|---|---|
| 6,185,155 | B1* | 2/2001 | Steinich | G01B 17/00 367/140 |
| 6,989,924 | B1* | 1/2006 | Jorgensen | F24J 2/1057 359/360 |
| 7,129,422 | B2* | 10/2006 | Arnold | H05K 9/0024 174/377 |
| 7,553,579 | B2* | 6/2009 | Couse | H01M 8/0273 429/460 |
| 2004/0001299 | A1* | 1/2004 | van Haaster | G02B 6/4277 361/118 |
| 2008/0078576 | A1* | 4/2008 | Blacker | H05K 9/0081 174/388 |
| 2009/0117268 | A1* | 5/2009 | Lewis | B05D 1/60 427/205 |
| 2011/0263924 | A1* | 10/2011 | Yantasee | G01N 33/54326 600/12 |

\* cited by examiner

Electromagnetic shielding effectiveness of foam metal core of composite panel

Electromagnetic shielding effectiveness of expanded metal (open area = 60-70%)

Figure 5

Effectiveness of chemical-vapor-deposition nickel-coated non-woven fibers as electromagnetic shielding cover on quasi isotropic composite panels (shielding cover weight = 15 grams/meter$^2$; panel thickness = 0.004 inches)

Figure 6

Typical electromagnetic shielding effectiveness of metallic covers for composite panels

METHOD FOR MANUFACTURING A PANEL FOR A REFLECTIVE BROADBAND ELECTROMAGNETIC SHIELD

CROSS-REFERENCED RELATED APPLICATIONS

This application is a division of U.S. patent application Ser. No. 12/948,938 that was filed Nov. 18, 2010 now U.S. Pat. No. 9,144,185, and claims the benefit of and is a continuation-in-part application of U.S. Provisional Application Ser. No. 61/262,386 that was filed on Nov. 18, 2009. This application is also a continuation-in-part application of U.S. patent application Ser. No. 12/698,961 that was filed on Feb. 2, 2010 now U.S. Pat. No. 8,415,568, claiming the benefit as a continuation-in-part application of U.S. Provisional Application Ser. No. 61/149,116 that was filed on Feb. 2, 2009.

This application is related by subject matter to each of the following pending United States patent applications, which are individually and collectively incorporated herein by this reference:
   a. U.S. patent application Ser. No. 10/414,266;
   b. U.S. patent application Ser. No. 11/609,113;
   c. U.S. patent application Ser. No. 12/260,999; and
   d. U.S. patent application Ser. No. 12/261,006.

BACKGROUND OF THE INVENTION

Field of the Invention

The present invention relates to the design of electromagnetic shielding. More particularly, the present invention pertains to panels capable of providing electromagnetic shielding for an interior space.

Background

Optimum electromagnetic shielding offers broadband protection from very low frequencies on the order of a few kilohertz to very high frequencies on the order of tens of gigahertz. Electromagnetic signals at low frequencies have long wavelengths, while electromagnetic signals of high frequencies exhibit short wavelengths.

Fundamental material properties impact the capability of a material to shield from electromagnetic signals. The most significant of these are electrical conductivity, magnetic permeability, thickness, and geometric morphology. The most relevant of these material variables is dictated by the situation of use, as for example, by the intensity of anticipated electromagnetic radiation, or by whether the radiation is emitted from a proximate near field source or a remote far domain source.

Polymer systems and fiber-reinforced composite materials play an increasingly important structural role in many contemporary applications. These materials exhibit high specific stiffness and strength. Many are advantageously easy to manufacture and assemble. Still, as a group such polymer and composite systems exhibit poor electrical properties, and are not, therefore, particularly recommended for use in electromagnetic shielding.

BRIEF SUMMARY OF THE INVENTION

According to an initial aspect of the present invention, a panel for an electromagnetic shield includes a light-weight, porous, electrically-conductive core layer defined between generally parallel first and second surfaces and a first face sheet laminated to the first surface of the core layer and having rigidity properties superior to the rigidity properties of the core layer. The core layer may be made of a fluid-permeable material. The distance between the first and second surfaces of the core layer defines a thickness of the core layer. The thickness of the first face sheet may substantially less than the thickness of the core layer, approximately equal to that of the core layer, or even larger that the thickness of the core layer.

In one embodiment, the core layer is made of metallic foam. Another embodiment includes a metal coating on an electrically-nonconductive, porous, nonmetallic substrate chosen from a group of materials that includes nonwoven fibrous matting, paper, and open-cell nonmetallic foam. Alternatively, the core layer is made up of liberated branching metal nanostrands or a plurality of electrically-coupled, electrically-conductive particles. Each of the particles takes the form of an electrically-nonconductive, nonmetallic substrate with a metal coating.

The first face sheet includes a cured layer of resin with electrically-conductive elements distributed throughout the resin. The electrically-conductive elements are selected from among a group including liberated branched metal nanostrands, metal wires, and metal meshes, or electrically-conductive elements in the first face sheet are selected from a group of electrically-conductive elements are metal-coated fibers, woven fabric, nonwoven matting, or paper. Both being electrically-conductive, between the first face sheet and the first surface of the core is interposed an electrically-conductive adhesive layer.

The inventive panel may also include a fluid-impermeable second face sheet that is laminated to the second surface of the core layer. The second face sheet has rigidity properties superior to the rigidity properties of the core layer. When the second face sheet is electrically-conductive, and the panel may also include an electrically-conductive adhesive layer between the second face sheet and the second surface of the core layer.

In yet another aspect of the present invention, a panel for a broadband electromagnetic shield includes a core having first and second surfaces on opposite sides thereof with the distance between the first and second surfaces defining the thickness of the core. A layered electrically-conductive composite cover is disposed on the first surface of the core having a thickness substantially less than the thickness of the core. The cover contains a first stratum of porous metal secured to the core and exhibiting pronounced low-frequency electromagnetic shielding properties and a second stratum of electrically-conductive elements exhibiting pronounced high-frequency electromagnetic shielding properties secured in an overlapping electrically-continuous relationship to the first stratum. An adhesive may be used to secure the first stratum to the first face of the core, or the first stratum may be secured to the core indirectly by way of the second stratum.

The first stratum is a metallic lattice of the type chosen from a group comprising a metal screen, a metal mesh, an expanded metal foil, and a perforated metal sheet. Alternatively, the first stratum may take the form of a noncontinuous, patterned metal film disposed on the first surface of the core using a process selected from the group comprising spraying, vapor deposition, electrodeposition, dipping, rolling, and brushing. The first stratum is made from a metal, such as a μ-metal, nickel, copper, aluminum, bronze, iron, steel, and co-plating or alloys of any thereof. An adhesive may used to secure the second stratum to the first face of the core, or the second stratum may be secured to the core indirectly by way of the first stratum.

The electrically-conductive elements of the second stratum are a non-woven veil of electrically-nonconductive fibers (or poorly conductive fibers, e.g., carbon) coated by a metal. The fibers assume the form of a scrim, a mat, and a paper of individually-metalized fibers or fibers assembled in a non-woven relationship and coated collectively by a metal in a chemical vapor deposition. The metal used in the second stratum may be nickel, copper, aluminum, iron, and alloys of any thereof.

The core may or may not be structurally self supporting, or substantially planar with parallel first and second faces. The core may be made entirely of an electrically nonconductive resin, or the core may in the alternative be made a resin body with fibers of glass, carbon, or a polymer embedded therein.

The teachings of present invention also include various related methodologies. For example, within the scope of the present invention are methods for manufacturing a panel for an electromagnetic shield. Also within the scope of the present invention are methods for manufacturing an electromagnetic shielding cover for composite panels of diverse constructions constructions.

BRIEF DESCRIPTION OF THE SEVERAL VIEWS OF THE DRAWINGS

In order that the manner in which the above-recited and other features and advantages of the present invention are obtained will be readily understood, a more particular description of the present invention briefly described above will be rendered by reference to specific embodiments thereof which are illustrated in the appended drawings. Understanding that these drawings depict only typical embodiments of the present invention and are not therefore to be considered to be limiting of scope thereof, the present invention will be described and explained with additional specificity and detail through the use of the accompanying drawings in which.

DETAILED DESCRIPTION OF THE INVENTION

The presently preferred embodiments of the present invention will be best understood by reference to the drawings, wherein like parts are designated by like numerals throughout. It will be readily understood that the components of the present invention, as generally described and illustrated in the figures herein, could be arranged and designed in a wide variety of different configurations. Thus, the following more detailed description of the embodiments of the present invention, as represented in FIGS. 1-4, is not intended to limit the scope of the invention, as claimed, but is merely representative of presently preferred embodiments of the invention.

Figure 1:
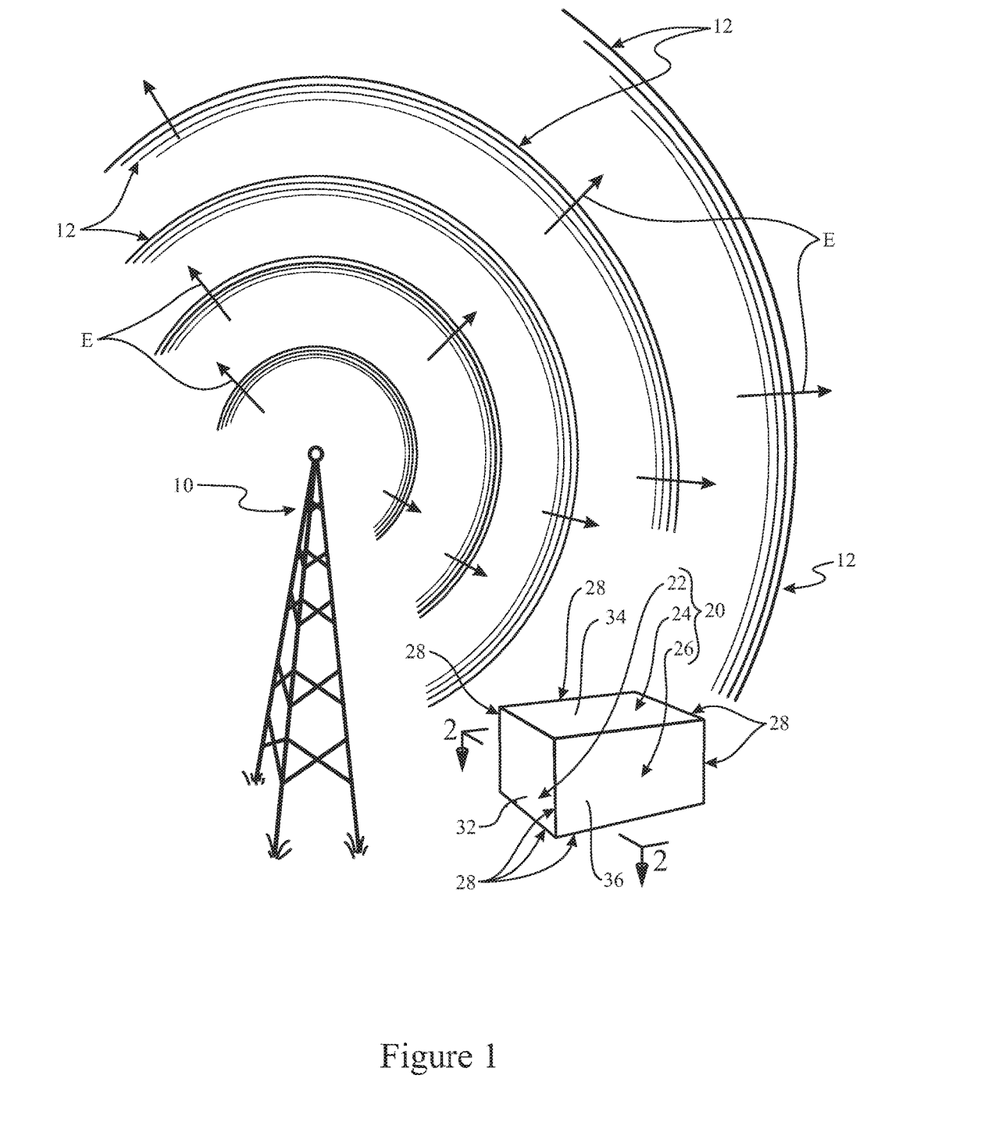
FIG. 1 is an illustrative depiction of a source of electromagnetic signal radiation and an enclosure for an interior space that, by incorporating teachings of the present invention, provides broadband electromagnetic shielding for that interior space.

FIG. 1 depicts a typical environment in which teachings of the present invention find utility. There a radio transmitter tower 10 is shown as a typical source of outgoing electromagnetic signal radiation 12 that travels outwardly away from radio transmitter tower 10, as suggested by arrows E. Shielding from electromagnetic signal radiation 12 is desired on behalf of a sensitive electronic device within the transmission range of transmitter tower 10.

Figure 2:
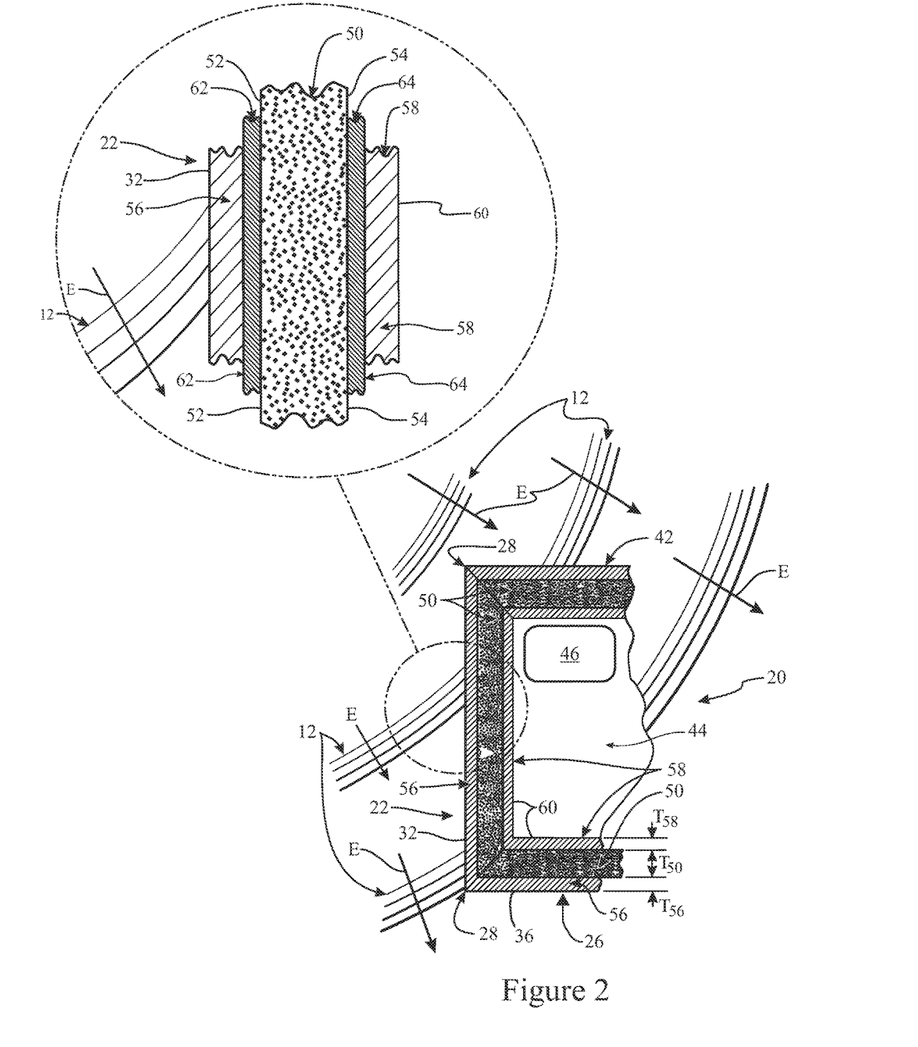
FIG. 2 is a cross section of the enclosure of FIG. 1 taken along section line 2-2 therein that includes in an inset a highly magnified view in cross section of a first embodiment of a panel of an electromagnetic shield incorporating teachings of the present invention.

Toward that end, the electronic device, which is not actually visible in FIG. 1, is housed in an electromagnetic-shielding enclosure 20 that incorporates teachings of the present invention. Electromagnetic-shielding enclosure 20 thus provides broadband electromagnetic shielding from electromagnetic signal radiation 12 for the interior space within electromagnetic-shielding enclosure 20. As seen by way of example in FIG. 1, electromagnetic-shielding enclosure 20 includes a square electromagnetic-shielding front panel 22, a rectangular electromagnetic-shielding top panel 24, and a similarly shaped electromagnetic-shielding side panel 26. Corresponding opposite panels (not visible in FIG. 1) are disposed opposite and spaced from panels 22, 24, and 26 to form the enclosure 20. In FIG. 2, the panel opposite top panel 24 is floor panel 44 and the panel opposite side panel 26 is second side panel 42. Panels 22, 24, 26 and opposite panels meet and are attached in an electrically coupled manner at respective joints 28 between each pair thereof. As a result, electromagnetic signal radiation 12 is precluded from penetrating into the interior of the enclosure 20 through any of the electromagnetic shielding panels or interfering with the intended operation of the electronic device housed within the enclosure.

An electromagnetic-shielding enclosure, such as electromagnetic-shielding enclosure 20, may assume diverse configurations, involving assemblies with greater or lesser symmetry, with irregular or nonplanar outer surfaces, with more or fewer panels and more or fewer joints therebetween than are included in electromagnetic-shielding enclosure 20. For example, an electromagnetic-shielding enclosure, such as electromagnetic-shielding enclosure 20, may take the form of a pair of semispherical electromagnetic-shielding panels that are attached in an electrically coupled manner at a single continuous circumferential joint. As used herein and applied to an electromagnetic-shielding panel, the expressions planar and substantially planar are intended to include even electromagnetic-shielding panels that, while exhibiting curvatures or having flexibility, have a thickness between the opposite surfaces thereof that is substantially unchanging throughout the entire electromagnetic-shielding panel.

The physical and material considerations governing the formation of panels 22, 24, and 26 will be addressed following a brief discussion of some material properties that impact the capability of the constituent materials of panels 22, 24, and 26 to effectively shield the interior of electromagnetic-shielding enclosure 20 from electromagnetic signals 12.

One characteristic of electromagnetic waves is wave impedance. This is defined as the ratio of the electric field (E-field, volts per meter) to the magnetic field (H-field, amps per meter) of the electromagnetic radiation. A low impedance wave will have a low E-field and high H-field, and a high impedance wave will have a high E-field and low H-field. Thus, low impedance wave shielding is concerned more with magnetic permeability and absorption, while high impedance wave shielding is concerned more with electrical conductivity.

The shielding effectiveness SE of an electromagnetic-shielding material is expressed in decibel units, and represents the quantity of an electromagnetic field that is attenuated by an electromagnetic-shielding barrier made of the electromagnetic-shielding material in question.

The shielding effectiveness SE of a material is calculated using Equation 1 below.

$$SE=R+A+B, \quad \text{Equation 1:}$$

where, R=reflection shielding mechanism in decibels;
A=absorption shielding mechanism in decibels; and
B=re-reflection shielding mechanism in decibels.

The reflection shielding mechanism R of an electromagnetic-shielding material is expressed in decibel units. Reflection shielding mechanism R is a function variously of (1) the impedance $Z_1$ of an electromagnetic-shielding wave in a medium surrounding an electromagnetic-shielding barrier made of the electromagnetic-shielding material in question, (2) the impedance $Z_2$ of the electromagnetic-shielding wave in the electromagnetic-shielding shielding barrier, (3) the electrical conductivity σ of the electromagnetic-shielding barrier, (4) the magnetic permeability μ of the electromagnetic-shielding barrier, and (5) the frequency f of the electromagnetic-shielding wave itself.

The impedance $Z_2$ of an electromagnetic-shielding wave in an electromagnetic-shielding shielding barrier is calculated using Equation 2 below $$Z_2 = \sqrt{\frac{2\pi f \mu}{\sigma}}, \quad \text{Equation 2}$$

where, f=electromagnetic-shielding wave frequency in hertz;
μ=electromagnetic-shielding barrier magnetic permeability in volt-second per ampere per meter; and
σ=electromagnetic-shielding barrier electrical conductivity in siemens per centimeter.

The reflection shielding mechanism R of an electromagnetic-shielding material is calculated using Equation 3 below.

$$R = 20\log\left(\frac{Z_1}{4Z_2}\right), \quad \text{Equation 3}$$

where, $Z_1$=impedance in ohms of medium surrounding electromagnetic-shielding barrier; and $Z_2$=impedance in ohms of electromagnetic-shielding shielding barrier.

The greater the impedance mismatch between an electromagnetic-shielding shield and its surrounding medium, the greater the shielding effectiveness of the electromagnetic-shielding shield. Thus, the use of highly electrically-conductive materials leads to greater reflection.

The absorption shielding mechanism A is expressed in decibels and is calculated using Equation 4 below.

$$A = 20 \log e^{\frac{t}{\delta}}, \quad \text{Equation 4}$$

where, t=electromagnetic-shielding barrier thickness in length units; and
δ=electromagnetic-shielding barrier skin depth in length units.

An increase in the exponent of Equation 4 is achieved by increasing thickness t or decreasing skin depth δ.

Skin depth δ can be considered to be the depth of penetration into an electromagnetic-shielding barrier by an incident electromagnetic wave at a given frequency. Fundamentally, skin depth δ dictates the loss of amplitude of an incident wave in an electromagnetic-shielding barrier. Thus, a given skin depth will lead to a proportional unit loss of amplitude in any incident electromagnetic wave. For example, a single unit of skin depth typically reduces the amplitude of an electromagnetic wave by 1/e, or about 37%. Thus, reducing the skin depth of an electromagnetic-shielding material leads to reductions in the total required thickness of an electromagnetic-shielding made from the material, while still maintaining electromagnetic shield levels.

Skin depth δ is calculated using Equation 5 below.

$$\delta = \frac{1}{\sqrt{\pi f \sigma \mu}}, \quad \text{Equation 5}$$

where, f=electromagnetic-shielding wave frequency in hertz;
σ=electromagnetic-shielding barrier electrical conductivity in siemens per centimeter; and
μ=electromagnetic-shielding barrier magnetic permeability in volt-second per ampere per meter.

Skin depth δ can be decreased by increasing one or both of electrical conductivity σ and magnetic permeability μ. Skin depth naturally decreases with increasing electromagnetic wave frequency f.

Physical and materials considerations of the geometrical morphology of the electromagnetic shield can also have importance. A solid, planar electromagnetic-shielding barrier must rely on its bulk material properties of conductivity and permeability alone for shielding effectiveness. An improved geometric morphology will be disclosed below relative to FIG. 2.

FIG. 2 is a cross-sectional plan view of front panel 22 of electromagnetic-shielding enclosure 20 between joint 28 at side panel 26 and joint 28 at a second side panel 42 that is not visible in FIG. 1. Also newly revealed in FIG. 2 is a floor panel 44 of electromagnetic-shielding enclosure 20 that is provided with the same electromagnetic shielding capacity as are the other panels of electromagnetic-shielding enclosure 20. Resting upon floor panel 44, interior of electromagnetic-shielding enclosure 20 in the vicinity of joint 28 between front panel 22 and second side panel 42, is an electronic device 46 that is being shielded from electromagnetic signal radiation 12 by electromagnetic-shielding enclosure 20.

Each of the panels of electromagnetic shielding enclosure 20 may be of a unique construction, provided that each panel incorporates appropriate insights from among the teachings of the present invention. For the sake of simplicity herein, however, it will be assumed that the construction of each of the panels of electromagnetic-shielding enclosure 20 is identical. Thus, the internal construction of side panel 26 will be explored in significant detail as being typical of all of the panels of electromagnetic-shielding enclosure 20, and the same reference characters used to do so in the following discussion will be used without further introduction whenever convenient herein and in the supporting drawings.

Side panel 26 includes a light-weight, porous, electrically-conductive planar core layer 50 having a first surface 52 that is oriented outwardly of electromagnetic-shielding enclosure 20 and a generally parallel second surface 54 on opposite side of core layer 50 that is oriented inwardly of electromagnetic-shielding enclosure 20. The distance between first surface 52 and second surface 54 defines a thickness $T_{50}$ of core layer 50. Laminated to first surface 52 of core layer 50 is a first face sheet 56, and laminated to second surfaces 54 of core layer 50 is a second face sheet 58. The outer surface of first face sheet 56 thus coincides with outer surface 36 of side panel 26, while the outer surface of second face sheet 58 defines an inner surface 60 of side panel 26. Similarly, the outer surface of first face sheet 56 coincides with the outer surface 32 of front panel 22 and with the outer surface 34 of top panel 24, respectively.

Either or both of first face sheet 56 and second face sheet 58 have rigidity properties that are superior to the rigidity properties of core layer 50. As used herein and applied to face sheets, such as first face sheet 56 and second face sheet 58, superior rigidity properties include superior tensile properties, superior stiffness properties, or superior tensile and stiffness properties combined. When laminated to core layer 50, either of both of first face sheet 56 and second surfaces 54 supplement the mechanical strength of core layer 50, causing side panel 26 to be able to function as a sturdy structural element of any enclosure in which it is included. For this reason, in many, but not necessary in all, occasions, first face sheet 56 has a thickness T % that is substantially less than thickness $T_{50}$ of core layer 50. Similarly, second face sheet 58 may have a thickness $T_{58}$ that is also less than thickness $T_{50}$ of core layer 50. By way of example, thickness $T_{50}$ of core layer 50 may be in the range of about 0.0625 inches, in which case thickness $T_{56}$ of first face sheet 56 and thickness $T_{58}$ of second face sheet 58 might be in the range of, or thickness $T_{58}$ of second face sheet 58 may be approximate to or even greater than thickness $T_{50}$ of core layer 50.

Core layer 50 may, to great advantage, be made of metal foam. Alternatively, core layer 50 may include a porous nonmetallic substrate and a metal coating on that substrate. The substrate in core layer 50 may be electrically-nonconductive and may be formed from a material selected from a group of materials comprising nonwoven fibrous matting, paper, and open-cell nonmetallic foam. Core layer 50 may also be made of a plurality of electrically-coupled, electrically-conductive particles. The electrically-conductive particles may be liberated branching metal nanostrands, or each of the electrically-conductive particles can be a nonmetallic substrate with a metal coating. Then, the nonmetallic substrate in each of the electrically-conductive particles may itself be electrically-nonconductive. Quite advantageously, core layer 50 is fluid-permeable in some embodiments.

The use of nickel foam as a conductive core material was unknown prior to the present invention. Advantageously, light-weight nickel foam is an item of commerce, although one available from only a limited number of sources. Nickel foam core provides the advantages of highly effective broadband shielding to a frequency of about 10 KHz to at least about 20 gigahertz, the added stiffness of foam core construction, and excellent through-plane and in-plane heat transfer properties, with opportunities, if desired, for both passive and active heat transfer.

Core layer 50 with the assistance of either or both of first face sheet 56 and second face sheet 58 need not rely on its own bulk material in order to serve as a sturdy structural element of electromagnetic-shielding enclosure 20. Core layer 50 can take the form of a grating, or screen pattern of discreet wires. Further, core layer 50 may have an open pattern built from overlapping interconnected layers of such materials three-dimensionally randomly positioned relative to each other. Such a pattern of overlapped materials results substantially in a physically-obstructed planar barrier to incident electromagnetic waves, such as electromagnetic signal radiation 12, but such a pattern of overlapped materials allows electromagnetic waves that do penetrate the outermost layers of the pattern to be reflected internally and absorbed within the overlapped materials in the manner of a network of faraday cages within a shielding barrier that trap and dissipate penetrative incident electromagnetic radiation.

Figure 3:
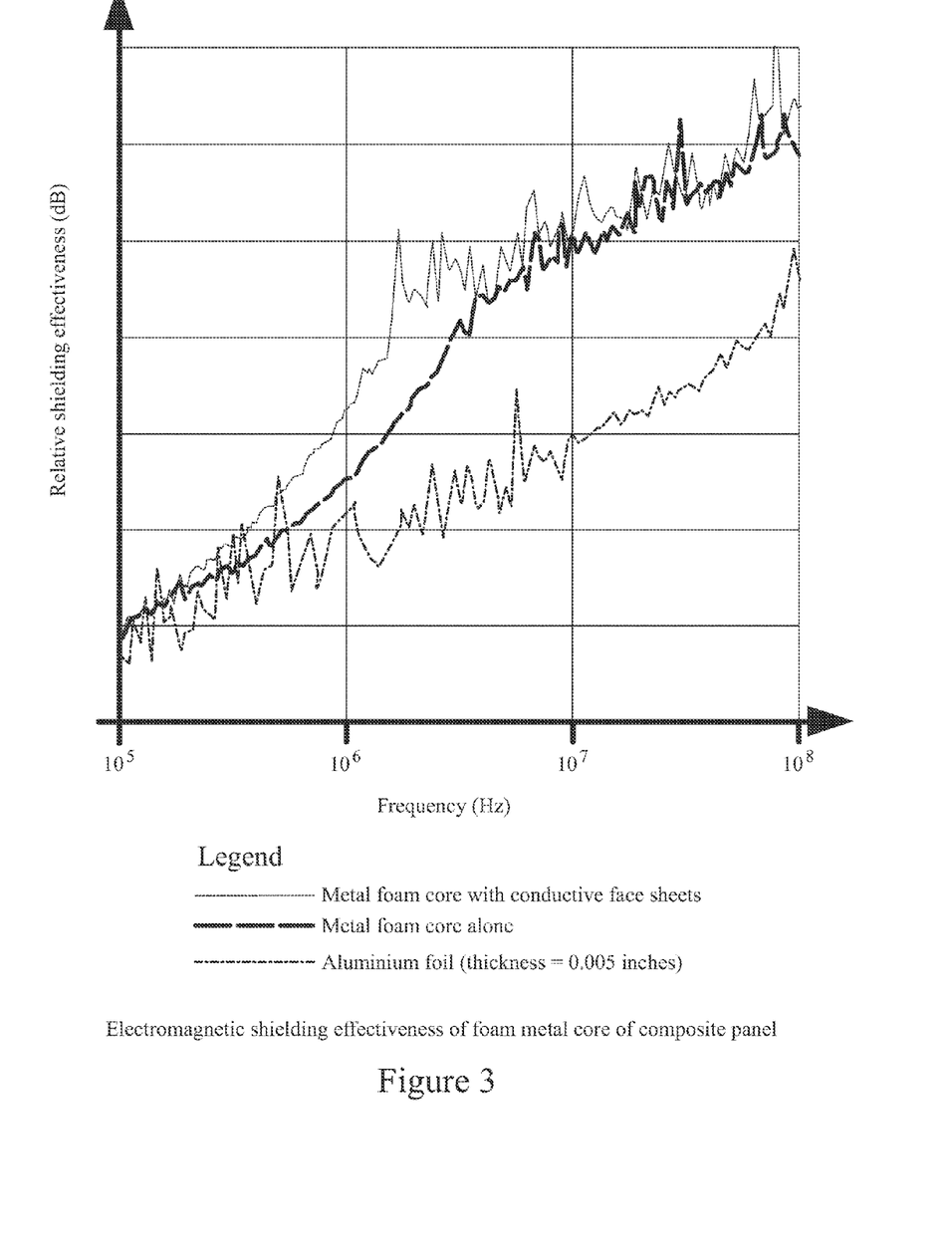
FIG. 3 is a graph depicting the effectiveness of foam metal as a core of a composite electromagnetic shielding panel.

FIG. 3 is a graph illustrating the electromagnetic shielding effectiveness of foam metal as the core of a panel of an electromagnetic field incorporating teachings of the present invention. There the performance of a stand-alone metal foam core and of a metal foam core with a pair of conductive face sheets compare favorably therein to the performance of a solid sheet of aluminum foil having a thickness of 0.005 inches.

Three dimensionally interconnected, open, and conductive porous materials can be made by coating with metal any of a number of substrates, including but not limited to foams, felts, fabrics, pads, scrims, papers, fiber matting, and filter media. Porous media coated with or made of nickel are particularly appropriate for several reasons. First of all, nickel is highly electrically conductive σ and exhibits high magnetic permeability μ. It is seen in the above equations that these material properties are advantageous in electromagnetic shielding, both independently and in combination with other constituent components of a composite structure. Porous media is additionally advantageous in electromagnetic-shielding applications, as providing a three-dimensionally interconnected, conductive grating to incoming radiation, along with a multiplicity of interconnected faraday cages. The use of porous media helps to keep weight to a minimum. Additional advantages, such as heat transfer through either or both of conduction and convection are afforded with a porous media that is thermally-conductive and possessed of a relatively high heat transfer coefficient. Porous media of several sizes can be combined to increase the broadband electromagnetic-shielding effectiveness of a composite. The porous media layers also act as structural or core layers in composite systems.

The key geometry in the above-described materials is the nature of the three-dimensional porosity. These kinds of materials can also be used on different scales to achieve different regions of shielding effectiveness. For example, substrates with smaller pores will shield higher frequencies, while substrates with larger pores will shield lower frequencies. The use of flexible or compressible porous media, such as nickel coated foam is recommended. With porous foam materials, the compressibility and flexibility of the foam is paramount. These foam materials can be face stitched to metal-coated fabric. While, such a dry sandwich is highly deformable and easily bendable and can serve as and creates an excellent electromagnetic-shield material, a dry sandwich of this type is not particularly recommended as a structural material.

As discussed above, however, an electromagnetic-shield panel, such as any panel of electromagnetic-shielding enclosure 20, is much more physically robust than the dry sandwich material discussed above. The use of a laminate composite involving core layer 50 among other layers results in stand-alone shielding layers, such as side panel 26 explored in relation to FIG. 2. The shielding effectiveness of composite systems and polymers is improved by using conductive porous materials, either alone or as core layers in structural laminates. Several different materials may be combined to produce any specific desired effect. Unprecedented levels of shielding effectiveness in composite materials have been demonstrated with these conductive porous layers, both alone and in composite systems. Nickel nanostrands, nickel coated fibers, and nickel coated non-woven paper may also be used in these systems to provide an additional region of broadband electromagnetic-shielding effectiveness.

One aspect of the present invention is that electrically-conductive and thermally-conductive foam cores act as foam core stiffeners in composite laminates. For instance, while non-conductive foam cores provide outstanding mechanical stiffness and energy absorption in a composite structure, the incorporation of metal foam cores provides the same mechanical advantages, but incorporates excellent thermal conductivity and electrical conductivity to the composite. The later property lends electromagnetic-shielding capacity to the composite.

When electrically-conductive foams are properly incorporated between laminate panels, such as the panels of electromagnetic-shielding enclosure 20 that are themselves electrically-conductive, the resulting composite structure displays an increased effective electromagnetic skin depth relative to the electromagnetic skin depth of the core foam material alone material. Thus, an electromagnetic-shielding-panel, such as side panel 26 of electromagnetic-shielding enclosure 20, may incorporate face sheets, such as first face sheet 56 and second face sheet 58, that are themselves electrically-conductive. The face sheet may include a cured layer of resin and electrically-conductive elements distributed throughout the layer of resin. Those electrically-conductive elements may be selected from a group of electrically-conductive elements comprising liberated branched metal nanostrands, metal wires, and metal meshes. In the alternative, the electrically-conductive elements are selected from a group of electrically-conductive elements comprising, fibers, woven fabric, nonwoven matting, and paper. These may be metal-coated as required by the circumstance of intended use. When an electrically-conductive face sheet is employed, it is advantageous to employ an electrically-conductive adhesive layer between the face sheet and the associated surface of the core layer.

A composite panel that results has commendable electrical conductivity and highly effective electromagnetic shielding, but that is yet very light-weight. For instance, panels with surface resistivity of a few milliohms and a volume resistivity equal to or less than a few milliohm-cm have been fabricated. These same panels, while being highly conductive and acting as very electromagnetically thick-skinned shields for low-frequency electromagnetic signals, also exhibit the light weight and high stiffness of foam core laminate composites. Composites with a density less than 1.00 gm/cc and a stiffness that is approximately equivalent to that of aluminum have been produced, and these exhibit electromagnetic-shielding capabilities that are beyond the limit of available electromagnetic test methodologies.

Thus, the teachings of the present invention include the use of open light-weight, electrically-conductive, fluid permeable materials as multifunctional structural core layer material for composite structures and as stand-alone broadband shielding panels with properties that are in some ways superior to those made from wires, meshes, or honeycombs. Such materials may be metal foam, if open-cell and structurally-stable, or any porous metal structure, whether it be foam, felt, or non-woven. The core may be a metal-coated porous material, such as open-cell or closed-cell foam, felt, cloth, or fiber matting. The core may also be made of metal particles, metal-coated particles, or self-supporting metal nanostructures, such as liberated branching metal nanostrands. The use of high electromagnetic-permeable metals, such as nickel, copper-nickel, nickel-iron, and perm alloy is recommended, particularly for shielding from lower frequency electromagnetic radiation.

In manufacturing a conductive composite, control is recommended of electrically conductivity and the magnetic permeability of all constituent elements of the composite. In light of the series of equations provided earlier, the goal should be to make the overall composite structure as electromagnetically thick as possible. The surface, the resin, the reinforcing fibers, and the core adhesive employed in the composite should each be as electrically-conductive as permitted by circumstances of anticipated use. Nickel nanostrands may be employed to create electrically-conductive surfaces, resins, and adhesives. Nickel-coated paper and nickel-coated fibers are recommended when reinforcement is called for, either in an electrical or in a structural sense. If the electromagnetic conductivity of any component or phase of a composite is poor, then the performance of the entire composite system will be compromised and not optimized.

Nickel foam alone does a great portion of low-frequency and high frequency electromagnetic-shielding. Within nickel foam are air passages that permit fluid flow, while the nickel of the foam affords broadband electromagnetic shielding. In structural applications, both in rigid panels made with epoxy composite and in flexible panels made with an elastomeric matrix, greater electromagnetic-shielding is attained where the surface and structural element of a composite panel is rendered as electrically-conductive as possible. Such a comprehensive and specific approach to electrical conductivity is appropriate, where multiple panels employing porous core composites are to be joined in an electrically continuous fashion into a larger overall structure. Adhesives and gap fillers are capable of effecting the desired joiner, if electrically-conductive.

The teaching of present invention also include methodologies. For example, within the scope of the present invention are methods for manufacturing a panel for a broadband electromagnetically shield.

By way of example, one embodiment of a method incorporating teachings of the present invention for manufacturing a panel for a broadband electromagnetic shield involves shaping a light-weight porous, electrically-conductive material into a substantially planar core layer, such as core layer 50, having first and second surfaces on opposite sides thereof. The process of shaping the core layer can be undertaken, either by first producing metal foam and then using the metal foam as the electrically-conductive material from which to form the core, or by producing a porous nonmetallic, electrically-nonconductive substrate, and coating the substrate with a metal.

Then a first face sheet, such as first face sheet 56 of FIG. 2, having rigidity properties superior to the rigidity properties of the core layer 50 is laminated on the first surface 52 of the core layer 50. The first face sheet 56 may be electrically-conductive, whereupon an electrically-conductive adhesive 62 may be interposed between the first face sheet 56 and the first surface 52 of the core layer 50. A second face sheet, such as second face sheet 58, having rigidity properties superior to the rigidity properties of the core layer 50 may be laminated to the second surface 54 of the core layer 50. If the second face sheet 58 is electrically conductive, an electrically-conductive adhesive 64 is interposed between the second face sheet 58 and the second surface 54 of the core layer 50.

Many combinations of the components recommended above can be used to achieve a broad range of electromagnetic, thermal, and structural efficacy. Using the methods described, variously above, it is possible to build composite structures that will shield from electromagnetic signals that are well in excess of about eighty decibels below a frequency of one megahertz. Such structures have a stiffness of about $30 \times 10^6$ pounds per square inch, approximate the stiffness of steel, and a density of about 1.35 grams per cubic centimeter, less that half the density of aluminum. Typical electrical properties achievable include a surface resistivity of about less than or equal to 0.003 ohm-per-square and a volume resistivity in a range of from about $10^{-2}$ to about $10^{-5}$ ohm-centimeters.

By way of recapitulation, the following description of a high-performance electromagnetic-shielding system is provided.

An electrically-conductive, and optionally thermally-conductive, porous core composite panel structure is used as a broadband electromagnetic shield. The porous core may be metal foam, a porous self-supporting metal structure, metal particles, metal nanostrands, or a metal coated porous substrate, such as an open-cell or closed-cell foam, felt, cloth, fibrous matting, electrically-nonconductive coated particles. Highly electromagnetically-permeable metals, such as nickel, copper nickel, and perm alloy are recommended, particularly for the electromagnetic shielding from electromagnetic radiation at lower frequencies.

The face sheets used on a foam core need not be electrically-conductive, but more effective electromagnetic shielding is achieved, if the face sheets are electrically-conductive. This is particularly the case, when it comes to achieving electrical continuity between structurally adjacent constituent elements in a larger electromagnetic enclosure. The face sheets may be made conductive by the use of metal wires or meshes, metal coated fibers, conductive resins such as nanostrand bearing resins, and paper nickel-coated by chemical vapor deposition processes applied to the surface of the face sheets with nickel nanostrand bearing resins. The polymer resins employed in the face sheets range from a stiff epoxy to an elastomer. Correspondingly, the resulting composite panel will be rigid or flexible. The composite face sheets are joined to both faces of the electrically-conductive porous core with an electrically-conductive adhesive, such as an adhesive made conductive through the inclusion therein of nickel nanostrands.

Electrically-conductive coatings, adhesives, and elastomers are used to join panels, achieving mechanical integrity and electrical continuity. Though the porous electrically-conductive core alone is an excellent electromagnetic shield, electrically-conductive composite face sheets, resins, and adhesives provide significant improvement in the overall electromagnetic-shielding that can be produced.

In yet another vein, polymer systems and fiber-reinforced composite materials play increasingly important structural roles in civil, industrial, and military applications. These materials exhibit high specific stiffness and strength and often have additional advantages in other areas, such as ease of manufacturability. These polymer or composite systems exhibit poor electrical properties, particularly with respect to electromagnetic shielding. A transition is currently taking place in the materials industry to fabricate structures from fiber reinforced composites, rather than from isotropic metals. An example of this process can be observed in aircraft and satellite construction. While such structures have in the past been built of aluminum or other lightweight metals, it is now increasingly the practice to build aircraft and satellites of carbon fiber reinforced composites.

Physical and materials considerations of the geometrical morphology of an electromagnetic shield have importance. A solid, planar shield must rely on bulk material properties alone, such as conductivity and permeability, for shielding effectiveness. Several fundamental material properties also dictate the electromagnetic capabilities of a material. With respect to electromagnetic shielding, important material properties are electrical conductivity, magnetic permeability, thickness, and geometry. The most significant variable may by each particular application, however. It is desirable for any electromagnetic shielding layer to offer broadband performance from very low frequencies on the order of a few kilohertz to very high frequency on the order of tens of gigahertz. From low to high frequencies, different considerations dominate depending on the characteristics of the specific electromagnetic waves involved. Considerations are also significant whether electromagnetic shielding should be effective in near field or far field domains. In all cases, it is advantageous to use highly conductive and highly electromagnetically permeable materials for electromagnetic shielding applications.

Figure 4:
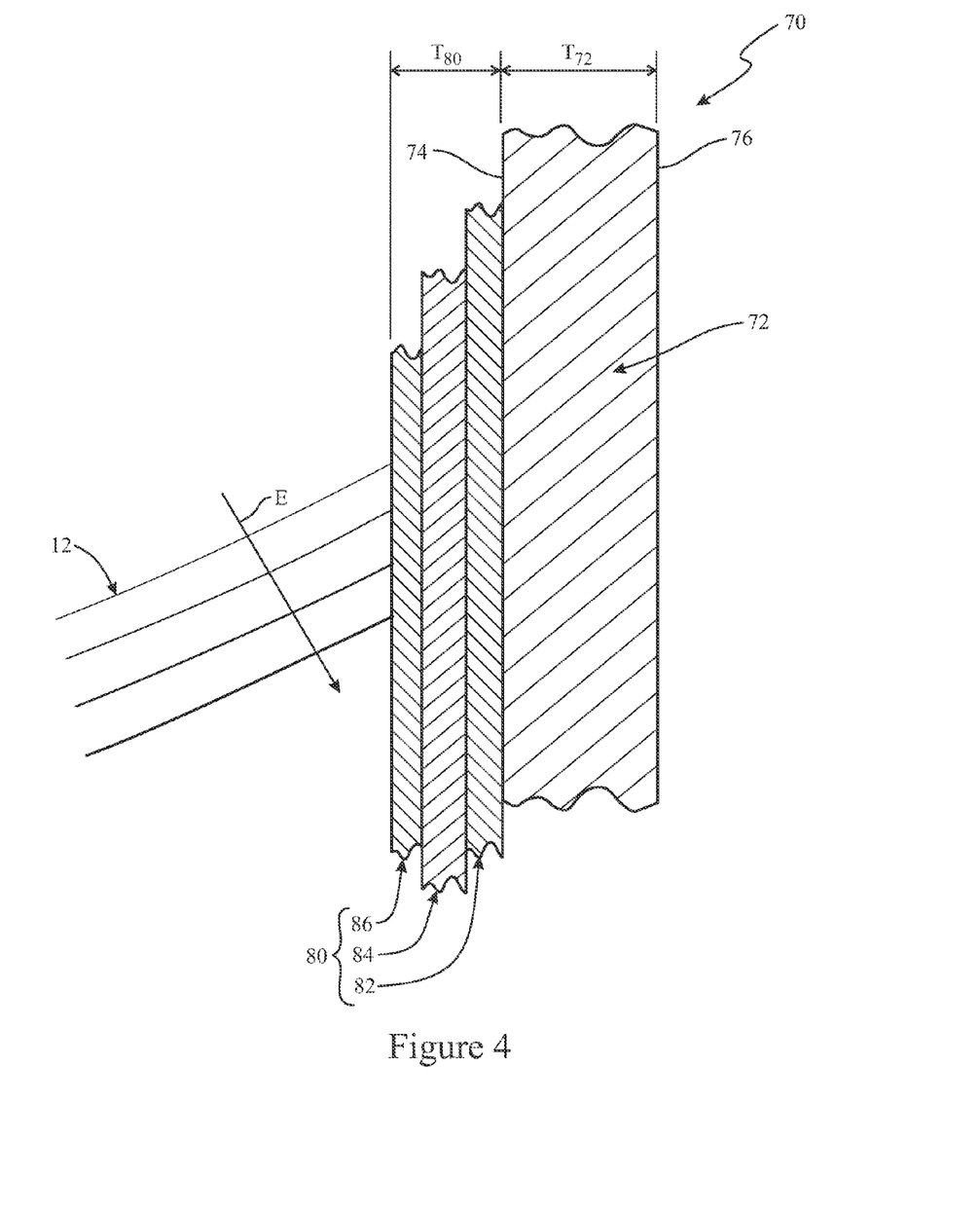
FIG. 4 is a cross section like that of the inset of FIG. 2 providing a highly magnified view in cross section of a second embodiment of a panel of an electromagnetic shield incorporating teachings of the present invention.

FIG. 4 is an enlarged cross-sectional view of a second embodiment of a front panel 70 incorporating teachings of the present invention for an electromagnetic-shielding enclosure that resolves these deficiencies in common composite materials by incorporating teachings of the present invention. Front panel 70 includes a structural core 72 having a first surface 74 and opposite thereto a second surface 76. The distance between first surface 74 and second surface 76 of core 72 defines the thickness $T_{72}$ of core 72.

A layered, electrically-conducting composite cover 80 is disposed on first surface 74 of core 72. Cover 80 has a thickness $T_{80}$ that may advantageously be substantially less than thickness $T_{72}$ of core 72. One technology found to be useful in constructing electromagnetic shielding for fiber reinforced composites is expanded metal foil or metal mesh, either of which may be co-cured directly onto a composite structure, or applied thereto in a secondary operation. By metal mesh, it is understood to mean any sheet-like metal material with porosity, including woven structures and expanded foil structures. The use of highly conductivity metals, such as nickel, copper, aluminum, or the alloys thereof are particularly suited to lower frequency electromagnetic shielding. Metal foils have excellent electrical conductivity and thus exhibit good electromagnetic shielding protection. The range of protection afforded by these materials is, however, limited to some extent and in selected situations, by the physical geometry of the metal foils. As frequency increases, wavelength decreases. At some point a metal mesh may no longer be acceptably effective in shielding electromagnetic waves. Still, cover 80 of front panel 70 includes a first stratum 82 of porous metal that exhibits pronounced low-frequency electromagnetic shielding properties. First stratum 82 is secured, either directly or indirectly, as shown in FIG. 4, to first surface 74 of core 72.

Another material that has been found to be useful in electromagnetic shielding is nickel coated carbon nonwoven broad goods. Nickel is particularly appropriate at a wide range of frequencies, as nickel is highly electrically conductive and exhibits high magnetic permeability. Metal-coated non-woven materials are made by forming a nonwoven of nickel coated carbon fibers or by chemical-vapor-deposition of nickel coatings on a formed carbon nonwoven. The latter are occasionally referred to as nickel-coated papers. Metal-coated non-wovens in this context include both non-wovens that are made with metalized fibers and non-wovens that are metalized in a secondary process. The use of highly conductivity and high permeability metals, such as nickel and the alloys thereof, are particularly suited to this role, and the chemical-vapor-deposition of these metals is particularly efficient.

Nickel-coated papers provide superior shielding effectiveness with an accompanying dramatic reduction in weight. The electromagnetic shielding effectiveness of a sheet of aluminum, like the electromagnetic shielding effectiveness of nickel-coated papers decrease in shielding effectiveness at low frequencies, however. Still, a second stratum 84 of electrically-conductive elements exhibiting pronounced high-frequency electromagnetic-shielding properties is secured in an overlapping and electrically-continuous relationship to first stratum 82. Typically, the electrically continuous relationship between the electrically-conductive elements of second stratum 84 and the porous metal of first stratum 82 is effected either by direct contact of those components or through the use of an electrically conductive adhesive disposed therebetween (not shown in FIG. 4). Second stratum 84 is secured, either directly or indirectly, as shown in FIG. 4, to first surface 74 of core 72. Cover 80 may include a protective coating 86 on the outer surface of the outermost of first stratum 82 and second stratum 84, when cover 80 is secured to core 72.

Thus, front panel 70 is composite electromagnetic shielding technology that provides broadband shielding, from low frequencies to high frequencies. A combination of expanded metal foils for low frequency effectiveness with metal coated non-woven broad goods for high frequency effectiveness results in a compellingly effective synthesis of different materials neither of which alone is capable of providing suitable broadband shielding. The result in some cases is even superior to the use of a solid metal sheet. Both first stratum 82 and second stratum 84 of cover 80 can be integrated onto core 72 in a single co-curing process, if desired, simplifying some aspects of manufacturing a composite core with effective electromagnetic shielding properties.

Core 72 is structurally self-supporting and may be substantially planar as shown in FIG. 4 with first surface 74 being generally parallel to second surface 76 thereof. Core 72 need not be electrically conductive, however. Core 72 may be made of a solid resin or of a body of resin with fibers, such as fibers of glass, carbon, or a polymer embedded therein.

First stratum 82 of cover 80 is a metal lattice, such as a metal screen, a metal mesh, an expanded metal foil, or a perforated metal sheet. Alternatively, the metal lattice of first stratum 82 may be a non-continuous, metal film that is disposed on first surface 74 of core 72 and is perforated by a pattern of apertures of dimensions commensurate with those associated with the forms of metallic lattice mentioned above. The deposition of such a metal film can be accomplished using spraying, vapor deposition, electrodeposition dipping, rolling, and brushing of the metallic material from which that layer is to be constructed. Whether applied in this manner or disposed as one of the other forms of metal lattice mentioned above, first stratum 82 may be made from an electromagnetically active metal, such as μ-metal, nickel, copper, aluminum, bronze, steel, and alloys of any thereof.

The constructions described above will achieve composite structures that shield very effectively in a frequency range from about 10 kilohertz to about 100 gigahertz. Typical electrical properties include a surface resistivity of about 0.006 ohm-per-square, and a volume resistivity in a range of from about $10^{-2}$ to $10^{-5}$ ohm-cm.

Figure 5:
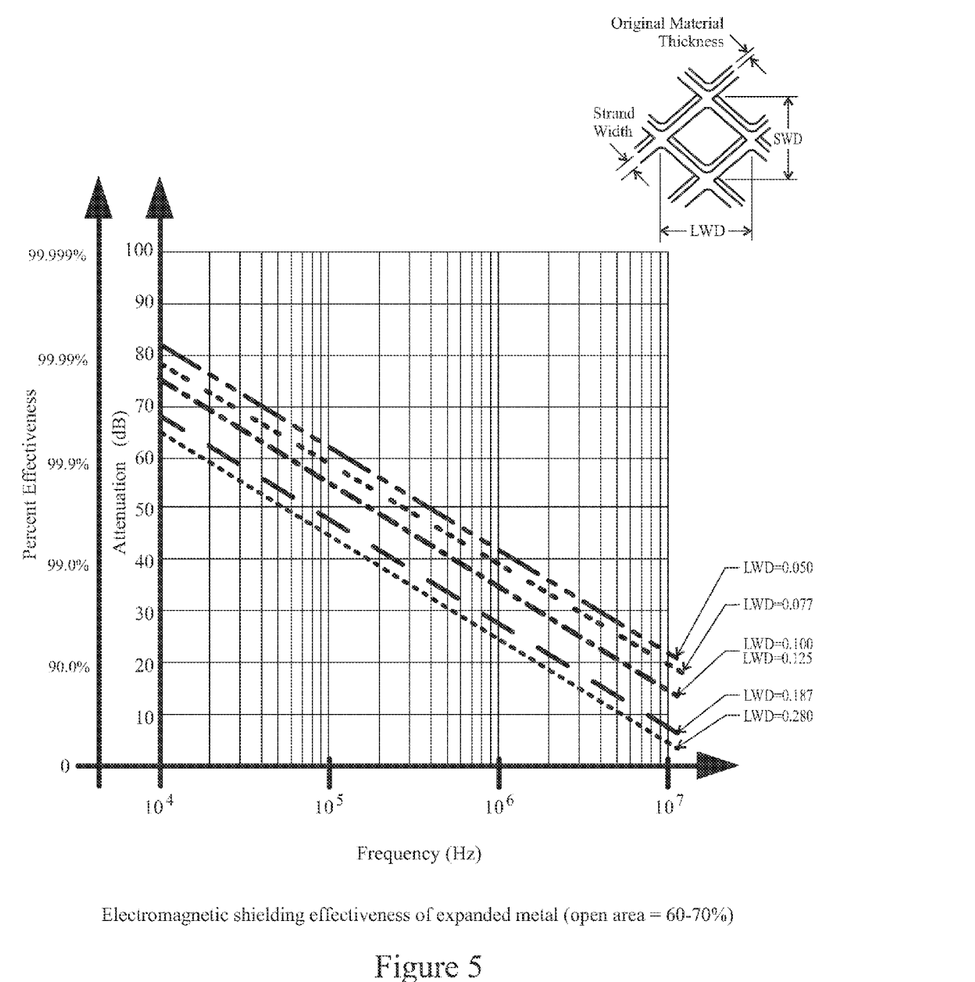
FIG. 5 is a graph depicting the electromagnetic shielding effectiveness of a layer of expanded metal of the type employed in the cover of the panel of the electromagnetic shield illustrated in FIG. 4.

FIG. 5 is a graph depicting the electromagnetic shielding effectiveness of various qualities of expanded metal having open areas in a range of from about 60% to about 70%. Five (5) types of expanded metal mesh are shown as tested. For convenience, FIG. 5 includes a highly enlarged illustrative depiction of the pores in such a layer of expanded metal. The electromagnetic shielding effectiveness of each of the samples shown in FIG. 5 is greatest at relatively low electromagnetic frequencies, and that the electromagnetic shielding effectiveness of each sample declines seemingly in a linear manner to low levels of electromagnetic shielding at higher electromagnetic frequencies. This is typical in expanded metal.

The electrically-conductive elements of second stratum 84 may be a non-woven veil of electrically non-conductive (or poorly conductive, such as carbon) fibers that are coated by a metal. The veil may take the form of a scrim of non-electrically conductive or poorly conductive fibers, a mat of electrically non-conductive or poorly conductive fibers, or a paper sheet of electrically non-conductive or poorly conductive fibers. The veil can be constructed from individually-metalized fibers, or the veil may be constructed of fibers assembled in a non-woven relationship and coated collectively with a metal subsequently thereto. Generally the metal coating will be a chemical vapor deposition of an electromagnetically active metal, such as nickel, copper, aluminum, iron, and alloys of any thereof.

Figure 6:
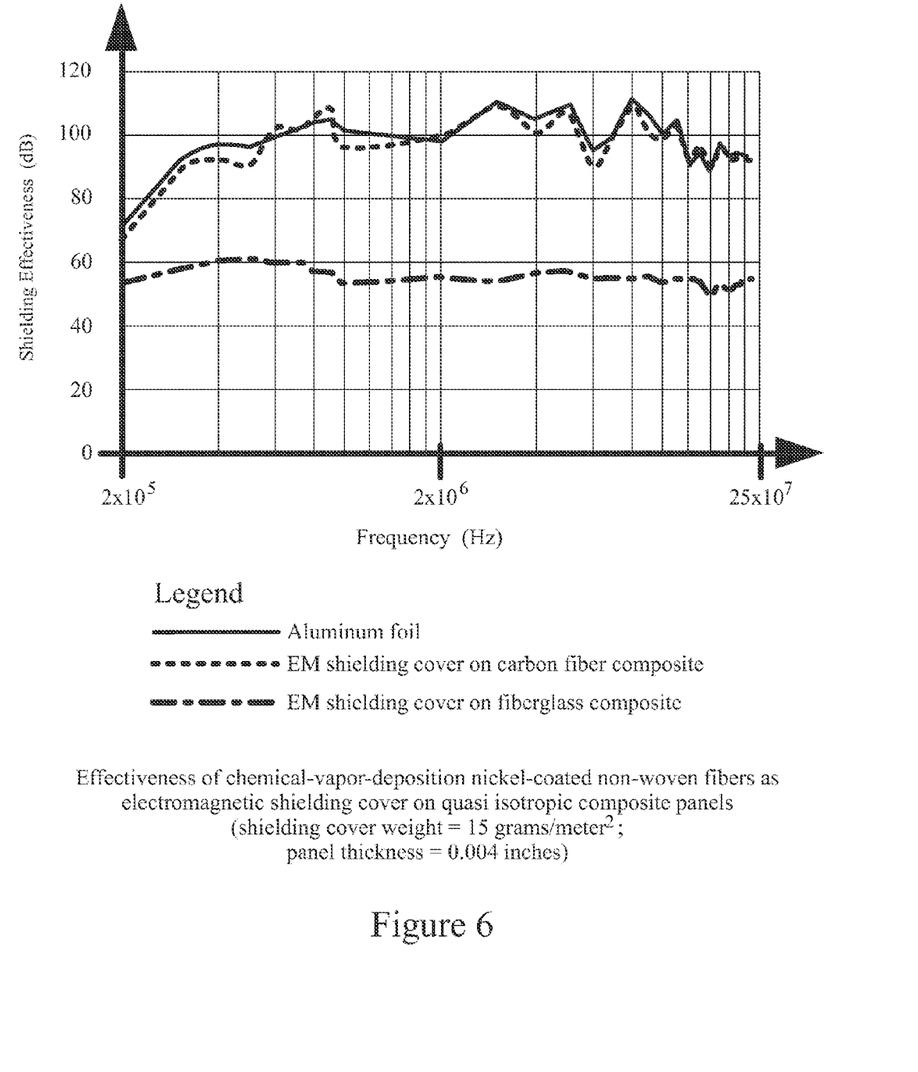
FIG. 6 is a graph depicting the electromagnetic shielding effectiveness of chemical-vapor-deposition metal-coated non-woven fibers of the type employed in the cover of the panel of then electromagnetic shield depicted in FIG. 4.

FIG. 6 is a graph illustrating the electromagnetic shielding effectiveness of chemical-vapor-deposition, nickel-coated, non-woven fibers of the type suitable for use in second stratum 84 of cover 80. Layers of such material are disposed on the surface of quasi-isotropic composite panels made, restrictively, of fiberglass or carbon fiber reinforced resin. The performance of these two (2) forms of electromagnetically shielded panels are compared with the electromagnetic shielding performance of aluminum foil.

Figure 7:
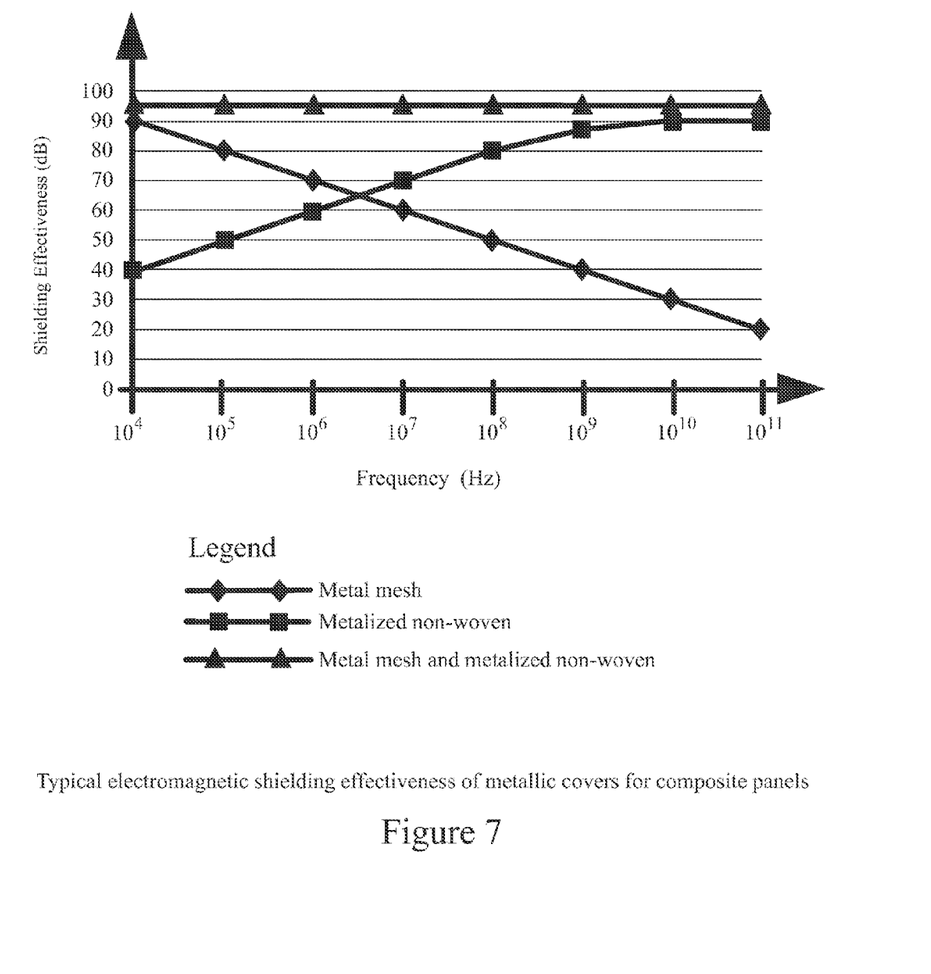
FIG. 7 is a graph depicting generally typical electromagnetic shielding effectiveness of the layers in the cover of the panel of the electromagnetic shield depicted in FIG. 4.

FIG. 7 illustrates the synergy produced by the use together of a first stratum of porous metal, such as that employed in first stratum 82 of cover 80, in an overlapping, electrically-continuous relationship to electrically conductive elements, such as those used in second stratum 84. The porous metal used in first stratum 82 of cover 80 exhibits pronounced low-frequency electromagnetic shielding properties, while the electrically conductive elements used in second stratum 84 exhibit pronounced high-frequency electromagnetic properties. When metallic layers of these contrasting types are employed in a single cover in an overlapping relationship in which electrical conductivity therebetween is maintained, the electromagnetic shielding effectiveness observed is dramatically broadband and extremely high.

Figure 8:
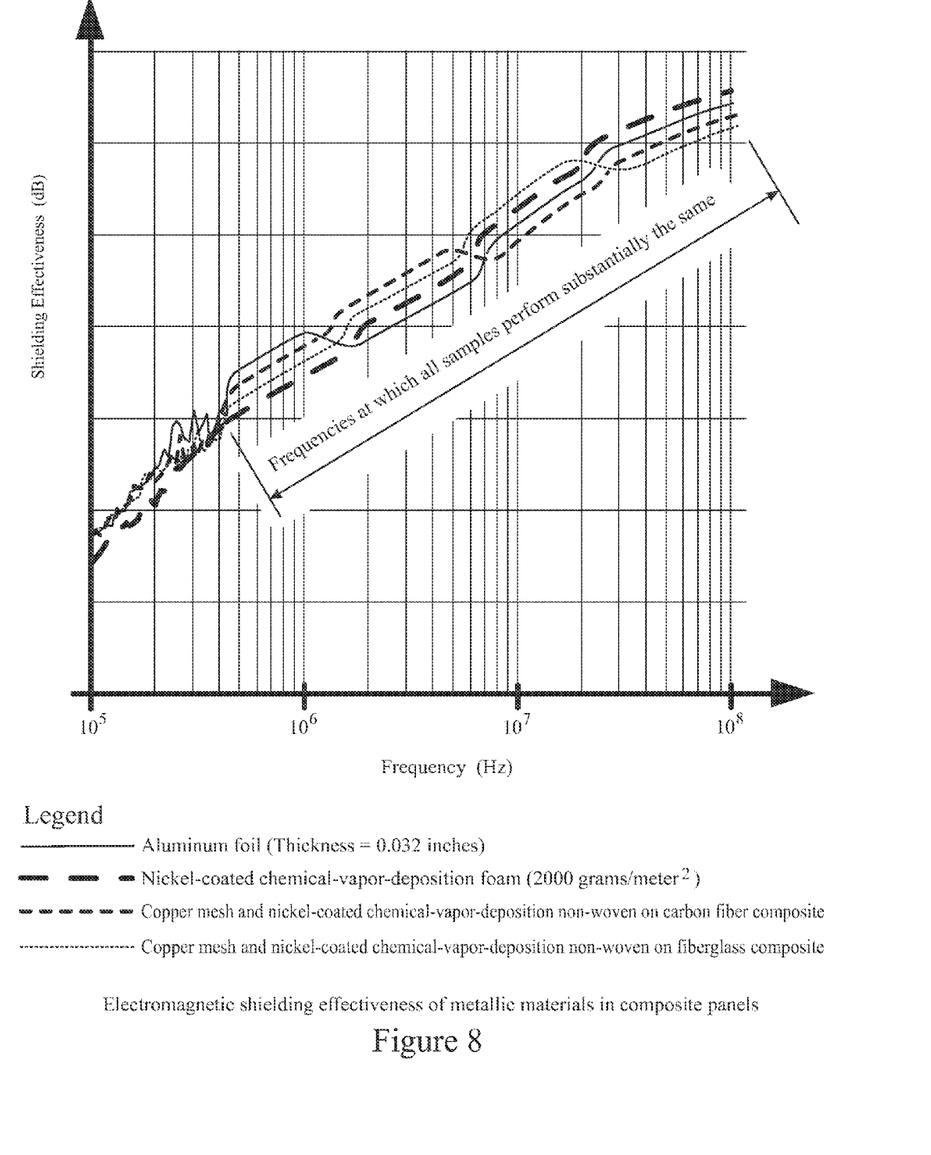
FIG. 8 is a graph depicting the comparative electromagnetic shielding effectiveness of the metallic materials employed in the embodiments of electromagnetic shielding panels depicted, respectively, in FIGS. 2 and 4.

FIG. 8 is a graph depicting to the extent possible the electromagnetic shielding effectiveness of a foam metal core of an electromagnetic shielding panel of the type depicted in FIG. 2, of electromagnetic shielding covers of the type depicted in FIG. 4, and of a baseline of aluminum foil that is 0.032 inches thick. At lower frequencies, between $10^5$ and $10^6$ hertz, the electromagnetic shielding performances of each of the constructions tested is discernable to a slight extent. On the other hand, due to limitations in the test methodology and equipment employed to secure the data exhibited in FIG. 8, in frequency ranges about and above $10^6$ Hertz, the four (4) performance curves cannot be meaningfully distinguished one from each other.

The present invention contemplates methods for manufacturing a panel for a broadband electromagnetic shield, such as front panel 70 illustrated in FIG. 4. Such a method commences with the step of forming a core of substantially the same size and shape as the desired electromagnetic shielding panel. The core by having first and second surfaces on opposite sides thereof has a thickness defined as the distance between those first and second surfaces. Then, a layered broadband electromagnetic shielding cover having a thickness substantially less than the thickness of the core is constructed and disposed on the first surface of the core. The building of the layered broadband electromagnetic shielding cover includes the steps of forming metal into a porous, first stratum that exhibits pronounced low-frequency electromagnetic shielding properties, assembling electrically conductive elements into a second stratum exhibiting pronounced high-frequency electromagnetic shielding properties, and securing the second stratum to the first stratum in an overlapping electrically-continuous relationship.

The first stratum is made up of a metallic lattice that may be disposed directly on the first surface of the core or secured thereto indirectly by attachment to the second stratum. The metallic lattice may assume various forms, such as a metal screen, a metal mesh, an expanded metal foil, or a perforated metal sheet. An adhesive may be applied between the first stratum and the first face of the core in securing the cover to the core. In the alternative, the first stratum can be a non-continuous metal film disposed on the first surface of the core using, by way of example spraying, vapor deposition, electrodeposition, dipping, rolling, and brushing.

The electrically conductive elements of the second stratum are maintained in an electrically-continuous relationship with the porous metal of the first stratum either by direct contact or through the use of an electrically conductive adhesive therebetween. The electrically conductive elements of the second stratum form a non-woven veil of electrically-nonconductive fibers that are coated by a metal. Those fibers may assume the form of a scrim, a mat, or a paper. The step of assembling such elements into the second stratum can be conducted by selecting electrically-nonconductive fibers, metalizing individual of the fibers to produce individually-metalized fibers, and arraying the individually-metalized fibers as a non-woven veil. Alternatively, the step of assembling can include selecting electrically nonconductive fibers, arraying the fibers in a non-woven veil, and metalizing the non-woven veil.

By way of further reiteration, fiber reinforced composite materials exhibit highly beneficial physical and mechanical properties with respect to strength, stiffness, and weight; when compared to the metals they often displace. Carbon fiber based composites are, however, poor electrical conductors, and glass fiber base composites are electrically nonconductive. As a result, composites in general exhibit very poor electromagnetic properties, and usually require secondary operations to provide any required electromagnetic protection. According to teachings of the present invention, such secondary operations include the incorporation into a fiber based composite of metal screens or expanded foils, surface foils, conductive scrims, conductive resins, and conductive coatings.

The protection provided by these secondary materials is very dependent upon physical and geometrical properties.

For example, metal meshes, expanded foils and screens have been found to provide acceptable low frequency protection, but as frequencies proceed above high megahertz or low gigahertz regions, electromagnetic wavelengths become short enough to pass right through the pores in these metal structures. Conductive coatings or resins have been determined to perform acceptably at higher frequencies, be they filled with materials, such as silver, copper, nickel or carbon particles, or with advanced nanomaterials, such as carbon nanotubes and nickel nanostrands. These nanomaterials usually provide cost-effective additions of decibels of protection, but placing any of these materials in a polymer reduces the conductivity of the consequent composite and results in electromagnetic shielding effectiveness that diminishes rapidly at frequencies below 100 megahertz. The same is true relative to conductive scrims, non-wovens, and other broad goods. Though shielding well at higher frequencies, these materials do not shield with any particular effectiveness at lower frequencies, and the electromagnetic screening protection provided by conductive broad goods that are woven is greatly reduced at higher frequencies due to the parallel orientation of the fibers thereof. Carbon fiber composites exhibit a rather narrow range of good performance, usually in a range from the high hundreds of megahertz to the low gigahertz. Above that range, the parallel orientation of the carbon fibers permits frequency-specific electromagnetic leakage, while below that range, carbon fibers exhibit neither sufficient permittivity nor permeability to provide effective skin depth. Even within their optimum range, carbon fiber composites supply all required mechanical strengths at thickness that are much less than a thickness needed to provide meaningful low frequency electromagnetic hardening. Metal foils provide acceptable high frequency protection, but metal foils are associated with problems, such as a need for significant touch labor, the use of adhesives that easily degrade, and thermal expansion mismatch problems. Some metals, such as aluminum are corrosive when used as foils with carbon fiber composites, and ultimately, as already discussed above, as a function of skin depth the electromagnetic screen effectiveness of foils declines at lower frequency.

Amid this swirl of diverse approaches to electromagnetic shielding, there is a frequency range from about 1.0 to about 100 megahertz within which no admirably effective electromagnetic screening can be secured except by the use of metals. Above and below this troublesome range, acceptable approaches have been found.

Above a range from about 100 to about 500 megahertz, approaches have been found that provide remarkable electromagnetic hardening to frequencies in excess of about 20 gigahertz. By way of example, based on carbon nanotubes, nickel nanostrands, or metal-coated non-wovens, metallic sheets of less than 2.0 mils in thickness or sprayed metallic coatings of less than 5.0 mils in thickness have been incorporated into composite surfaces and found to produce desired amounts of electromagnetic shielding. In so doing, electrical surface resistance was maintained below 0.1 ohm per square and volume conductance was maintained in a range of from about 1000 to about 10,000 Siemens per centimeter.

Below a range of from about 1.0 to about 10 megahertz, metal screens and expanded foils have been found to provide acceptable electromagnetic protection that approaches the electromagnetic screening effectiveness of a solid metal sheet. Still, above this range, these exhibit electromagnetic leakage that increases with increasing frequency.

Optimum electromagnetic screening protection can be secured with a box made of a metal, such as steel or aluminum. These are, however, relatively heavy construction, particularly if intended to be self-supporting. Prior to the advent of the present invention, a composite structure that matches the high level of broadband protection afforded by a metal box has been unattainable.

Employing teachings of the present invention, however, it has been found that a nickel-coated, chemical-vapor-deposition, non-woven material possessed of acceptable electromagnetic shielding effectiveness down to a range of about 10 megahertz in combination with a copper expanded foil or mesh have together performed as a cover for a reinforced composite of fiberglass or carbon fibers that matches the performance of an aluminum plate having a thickness of 0.040 inches (1.0 millimeter). The resulting surface resistivity of the cover was less than or equal to about 3.0 milliohms per square. At higher frequencies, the nickel-coated, chemical-vapor-deposition, non-woven material of the combination provided electromagnetic saturation shielding effectiveness to about 20 gigahertz. At frequencies below 300 kilohertz, both the covered carbon fiber core and the fiberglass core matched the performance of the specified aluminum plate, and outperformed the metal foam core technology discussed relative to FIG. 2 metal foam core.

The present invention may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. A method for manufacturing a panel for a reflective broadband electromagnetic shield, the method comprising the steps of:
   (a) forming a core of substantially the same size and same shape as the panel, the core having first and second surfaces on opposite sides thereof with the distance between the first and second surfaces defining a thickness of the core;
   (b) building a layered, reflective broadband electromagnetic shielding cover having a thickness substantially less than the thickness of the core, wherein the step of building comprises the steps of:
      forming metal into a porous first stratum exhibiting pronounced low-frequency electromagnetic shielding properties;
      assembling electrically-conductive elements into a second stratum exhibiting pronounced high-frequency electromagnetic shielding properties; and
      securing the second stratum to the first stratum in an overlapping electrically-continuous relationship; and
   (c) disposing the cover on the first surface of the core.

2. The method as recited in claim 1, wherein the first stratum comprises a metallic lattice.

3. The method as recited in claim 2, wherein the metallic lattice has a form chosen from a group comprising metal screening, metal mesh, expanded metal foil, and perforated metal sheeting.

4. The method as recited in claim 1, wherein the first stratum comprises at least two metallic lattices and each such metallic lattice has a form chosen from a group comprising metal screening, metal mesh, expanded metal foil, and perforated metal sheeting, each of the metallic lattices differs in form from at least one other metallic lattice.

5. The method as recited in claim 1, wherein the first stratum comprises a noncontinuous metal film disposed on the first surface of the core using a process selected from the group of processes comprising spraying, vapor deposition, electrodeposition, dipping, rolling, and brushing.

6. The method as recited in claim 1, further comprising the step of applying adhesive between the first stratum and the first face of the core.

7. The method as recited in claim 1, wherein the electrically-conductive elements of the second stratum comprise a non-woven veil of electrically-nonconductive fibers coated by a metal.

8. The method as recited in claim 7, wherein the fibers assume a form selected from the group comprising a scrim, a mat, and a paper.

9. The method as recited in claim 7, wherein the step of assembling comprises the steps of:
   (a) selecting electrically-nonconductive fibers;
   (b) metalizing individual of the fibers to produce individually-metalized fibers; and
   (c) arraying the individually-metalized fibers as a non-woven veil.

10. The method as recited in claim 7, wherein the step of assembling comprises the steps of:
    (a) selecting electrically-nonconductive fibers;
    (b) arraying the fibers as a non-woven veil; and
    (c) metalizing the non-woven veil.

11. A method for manufacturing a panel for a reflective broadband electromagnetic shield, the method comprising the steps of:
    (a) forming a core of substantially the same size and same shape as the panel, the core having first and second surfaces on opposite sides thereof with the distance between the first and second surfaces defining the thickness of the core;
    (b) forming metal into a porous metallic lattice exhibiting pronounced low-frequency electromagnetic shielding properties;
    (c) assembling a non-woven veil of electrically-nonconductive fibers coated by a metal exhibiting pronounced high-frequency electromagnetic shielding properties;
    (d) securing the non-woven veil of electrically-nonconductive fibers coated by a metal to the porous metallic lattice in an overlapping electrically-continuous relationship to form a layered, reflective broadband electromagnetic shielding cover having a thickness substantially less than the thickness of the core; and
    (e) disposing the cover on the first surface of the core.

12. The method as recited in claim 11, wherein the metallic lattice has a form chosen from a group comprising metal screening, metal mesh, expanded metal foil, and perforated metal sheeting.

13. The method as recited in claim 11, wherein the electrically-nonconductive fibers assume a form selected from the group comprising a scrim, a mat, and a paper.

14. The method as recited in claim 11, wherein the step of assembling comprises the steps of:
(a) selecting electrically-nonconductive fibers;
(b) metalizing individual of the fibers to produce individually-metalized fibers; and
(c) arraying the individually-metalized fibers as a non-woven veil.

15. The method as recited in claim 11, wherein the step of assembling comprises the steps of:
(a) selecting electrically-nonconductive fibers;
(b) arraying the fibers as a non-woven veil; and
(c) metalizing the non-woven veil.

16. A method for manufacturing a panel for a reflective broadband electromagnetic shield, the method comprising the steps of:
(a) forming a core of substantially the same size and same shape as the panel, the core having first and second surfaces on opposite sides thereof with the distance between the first and second surfaces defining the thickness of the core;
(b) forming metal into a porous metallic lattice exhibiting pronounced low-frequency electromagnetic shielding properties;
(c) selecting electrically-nonconductive fibers;
(d) forming a non-woven veil of electrically-nonconductive fibers coated by a metal from the selected electrically-nonconductive fibers so that the a non-woven veil of electrically-nonconductive fibers coated by a metal exhibits pronounced high-frequency electromagnetic shielding properties;
(e) securing the non-woven veil of electrically-nonconductive fibers coated by a metal to the porous metallic lattice in an overlapping electrically-continuous relationship to form a layered, reflective broadband electromagnetic shielding cover having a thickness substantially less than the thickness of the core; and
(f) disposing the cover on the first surface of the core.

17. The method as recited in claim 16, wherein the step of forming a non-woven veil of electrically-nonconductive fibers coated by a metal comprises the steps of:
(a) metalizing individual of the fibers to produce individually-metalized fibers; and
(b) arraying the individually-metalized fibers as a non-woven veil.

18. The method as recited in claim 16, wherein the step of forming a non-woven veil of electrically-nonconductive fibers coated by a metal comprises the steps of:
(a) arraying the fibers as a non-woven veil; and
(b) metalizing the non-woven veil.

\* \* \* \* \*